(12) United States Patent
Toda et al.

(10) Patent No.: US 8,184,470 B2
(45) Date of Patent: May 22, 2012

(54) RESISTANCE CHANGE MEMORY DEVICE AND PROGRAMMING METHOD THEREOF

(75) Inventors: Haruki Toda, Yokohama (JP); Hiroto Nakai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 84 days.

(21) Appl. No.: 12/668,750

(22) PCT Filed: Jun. 25, 2008

(86) PCT No.: PCT/JP2008/061935
§ 371 (c)(1),
(2), (4) Date: Jan. 12, 2010

(87) PCT Pub. No.: WO2009/011221
PCT Pub. Date: Jan. 22, 2009

(65) Prior Publication Data
US 2010/0188885 A1    Jul. 29, 2010

(30) Foreign Application Priority Data
Jul. 18, 2007    (JP) .................................. 2007-186996

(51) Int. Cl.
*G11C 11/00*    (2006.01)
(52) U.S. Cl. ........ 365/148; 365/158; 365/171; 365/173; 365/163
(58) Field of Classification Search .................. 365/148, 365/158, 159, 161, 163, 171, 173, 174
See application file for complete search history.

(56) References Cited

U.S. PATENT DOCUMENTS

| | | | |
|---|---|---|---|
| 6,141,241 A | 10/2000 | Ovshinsky et al. | |
| 6,888,745 B2 * | 5/2005 | Ehiro et al. | 365/158 |
| 7,394,680 B2 | 7/2008 | Toda et al. | |
| 7,400,522 B2 | 7/2008 | Toda et al. | |
| 7,423,901 B2 * | 9/2008 | Sutardja | 365/163 |
| 7,623,370 B2 | 11/2009 | Toda et al. | |
| 2006/0126380 A1 | 6/2006 | Osada et al. | |
| 2007/0077699 A1 * | 4/2007 | Gordon et al. | 438/201 |
| 2007/0285963 A1 | 12/2007 | Toda et al. | |
| 2007/0285968 A1 | 12/2007 | Toda et al. | |
| 2007/0285969 A1 | 12/2007 | Toda et al. | |
| 2007/0285971 A1 | 12/2007 | Toda et al. | |
| 2008/0002455 A1 | 1/2008 | Toda et al. | |
| 2008/0002457 A1 | 1/2008 | Toda et al. | |

(Continued)

FOREIGN PATENT DOCUMENTS

JP    2002-203392    7/2002

(Continued)

OTHER PUBLICATIONS

Office Action issued Jun. 16, 2011 in Korea Application No. 10-2010-7003429 (With English Translation).

(Continued)

*Primary Examiner* — Huan Hoang
*Assistant Examiner* — Kretelia Graham
(74) *Attorney, Agent, or Firm* — Oblon, Spivak, McClelland, Maier & Neustadt, L.L.P.

(57) ABSTRACT

A method of programming a resistance change memory device includes: applying program voltage pulses to a memory cell for programming a target resistance value; setting thermal relaxation times between the respective program voltage pulses; and controlling the shape of each the program voltage pulse in accordance with the present cell's resistance value determined by the preceding program voltage pulse application.

7 Claims, 9 Drawing Sheets

U.S. PATENT DOCUMENTS

2009/0122598 A1  5/2009  Toda et al.

FOREIGN PATENT DOCUMENTS

| | | |
|---|---|---|
| JP | 2002 541613 | 12/2002 |
| JP | 2004-342291 | 12/2004 |
| JP | 2006-510153 | 3/2006 |
| JP | 2006 155700 | 6/2006 |
| WO | 03 085675 | 10/2003 |
| WO | 2004 084229 | 9/2004 |

OTHER PUBLICATIONS

Office Action issued Jan. 17, 2012, in Japanese Patent Application No. 2007-186996, filed Jul. 18, 2007 (with English translataion).

* cited by examiner

RESISTANCE CHANGE MEMORY DEVICE AND PROGRAMMING METHOD THEREOF

TECHNICAL FIELD

This invention relates a resistance change memory device and programming method thereof.

BACKGROUND ART

There has been proposed a resistance change memory device, the resistance value of which is reversibly exchanged by applying voltage, current or heat, and one of states with the different resistance values is stored as data. It is noticed that this kind of memory device succeeds to the conventional flash memory. This resistance change memory is suitable for miniaturizing the cell size, and for constituting a cross-point cell array. In addition, it is easy to stack cell arrays.

There have already been proposed by us some three dimensional (3-D) cell array structures of this kind of memory devices. For example, refer to JP 2005-522045A (PCT/JP2003/000155), and JP 2006-514393A (PCT/JP2003/003257).

To make the best use of these properties, besides, to achieve high density and large capacity, it is effective to use such a multi-level data storage scheme that three or more resistance values are assigned to data. However, the resistance value of the variable resistance element in the resistance change memory will be set or reset in accordance with applied voltage or Joule's heat in such a way that, for example, charge movement occurs when the charge is activated to be over a certain potential barrier in the recording layer. Therefore, the data resistance value is statistically indefinite in principle, and specifically it is not easy in a multi level data storage scheme to set one or more medium resistance values between the highest resistance value and the lowest resistance value.

DISCLOSURE OF INVENTION

In accordance with one aspect of the invention, there is provided a method of programming a resistance change memory device including:

applying program voltage pulses to a memory cell for programming a target resistance value;

setting thermal relaxation times between the respective program voltage pulses; and controlling the shape of each the program voltage pulse in accordance with the present cell's resistance value determined by the preceding program voltage pulse application.

In accordance with another aspect of the invention, there is provided a resistance change memory device including:

a memory cell array having resistance change memory cells arranged;

sense amplifier configured to compare cell's current with reference cell's current;

plural pulse generation circuits configured to generate program voltage pulses with different pulse widths, one of which is selected and applied to a selected memory cell for programming a target resistance value;

a reference resistor prepared to be coupled to the sense amplifier at each program-verify time for verifying the program state of the selected memory cell, a reference resistance values being settable in the reference resistor in accordance with a current resistance value of the selected memory cell; and a resistance value programming logic circuit configured to switch multiple reference resistance values in the reference resistor in accordance with a verify-result with the sense amplifier, the verify-result being supplied for selecting one of the pulse generation circuits to be adapted for the following program voltage pulse application.

EMBODYING MODE

According to a first aspect of the present invention, for setting a stable data level, for example, a medium resistance value in a multi-level data storage scheme, it is used such a pulse control that a voltage pulse width at a program time is controlled in accordance with the resistance value obtained at the preceding program time, and thermal relaxation times are set between the respective voltage pulses for dispersing the Joule's heat generated in the memory cell to periphery.

According to a second aspect of the present invention, for making the resistance state changes constant at the respective program voltage pulse application times on the assumption that the resistance state change is mainly based on physical processes based on the Joule's heat and the cell's voltage, the pulse width is decided in such a way that the Joule's heat generated through the respective voltage pulse application times is made to be substantially constant, or the product of voltage by pulse width thereof is also made to be substantially constant.

Therefore, the following technical elements will be used in the embodiments described below.

(1) In a resistance change memory device with a recording layer, the resistance state of which is changed due to voltage, current or heat, for storing multi-level data in a memory cell by setting three of more resistance value levels, the resistance value state transition for setting a target resistance value in a memory cell is performed by applying multiple voltage pulses, and the pulse shape will be determined in accordance with the result of the preceding voltage pulse application.

(2) With respect to the program voltage pulses applied to set a target resistance value in a memory cell, thermal relaxation times are set between adjacent program voltage pulses for relaxing or dispersing the heat generated in the memory cell to periphery.

(3) To judge multiple resistance values to be set in a memory cell, multiple resistance value sections are defined by multiple boundary resistance values, which are set as reference resistance values between the multiple resistance values. Comparing a cell resistance value with the boundary resistance values, it is judged which resistance value section the cell's resistance value belongs to in accordance with which of the cell's resistance value and the boundary resistance value is higher or lower.

(4) The boundary resistance values (i.e., the reference resistance values) are set by selecting the number of parallel-connected cells with a high resistance value.

(5) In a resistance change memory device, which has a recording layer, the resistance value of which is changed by applying voltage, current or heat, to store multi-level data in a memory cell, while multiple program voltage pulses are sequentially applied to the memory cell so as to change the resistance value from the initial and lowest resistance value state to a target value selected in multiple and higher resistance values, each voltage pulse shape is determined in accordance with the result of the preceding program voltage pulse in such a way that the Joule's heat generated in the cell is controlled to be substantially constant during the programming period.

(6) In a resistance change memory device, which has a recording layer, the resistance value of which is changed by applying voltage, current or heat, to store multi-level data in a memory cell, while multiple program voltage pulses are sequentially applied to the memory cell so as to change the resistance value from the initial and highest resistance value state to a target value selected in multiple and lower resistance values, each voltage pulse shape is determined in accordance with the result of the preceding program voltage pulse in such a way that the voltage integration value is controlled to be substantially constant during the programming period.

It should be noted that the present invention is adaptable to not only a multi-level data storage scheme but also a binary data storage scheme. For example, suppose such a case that one or more medium resistance values to be set between the lowest resistance value and the highest resistance value are not usable as data because these are not sufficiently stable. In this case, using only two data states, the lowest resistance value and the highest resistance value, binary data storage may be performed with the same sequence as the embodiment of the multi-level storage scheme, so as to obtain the target resistance value gradually and precisely.

Illustrative embodiments of this invention will be explained with reference to the accompanying drawings below.

Figure 1:
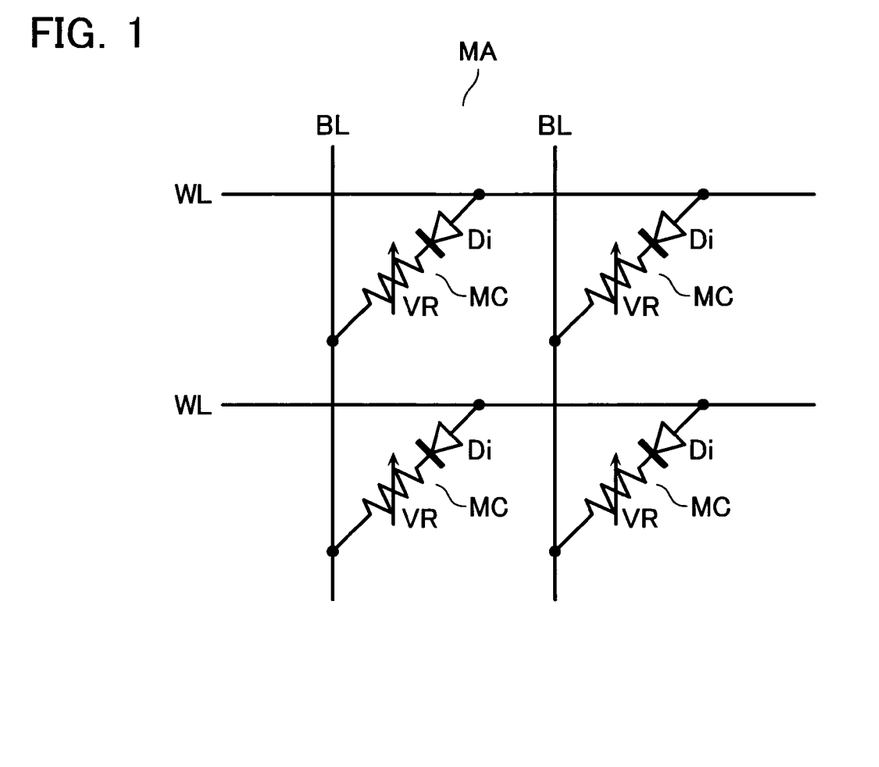
FIG. 1 shows an equivalent circuit of a memory cell array in accordance with an embodiment.

FIG. 1 shows an equivalent circuit of a memory cell array MA in accordance with an embodiment. As shown in FIG. 1, word lines WL and bit lines BL are arranged to cross each other, and a resistance change type of memory cells MC are disposed at the respective cross points of the word lines WL and bit lines BL. Each memory cell MC is formed of an access element Di and variable resistance element VR connected in series.

The variable resistance element VR has, for example, a structure containing electrode/transition metal oxide/electrode, so that the metal oxide (i.e., recording layer) is made to be changed in resistance in accordance with applied voltage, current and heat, thereby storing a resistance value state as data in a nonvolatile manner.

Figure 2:
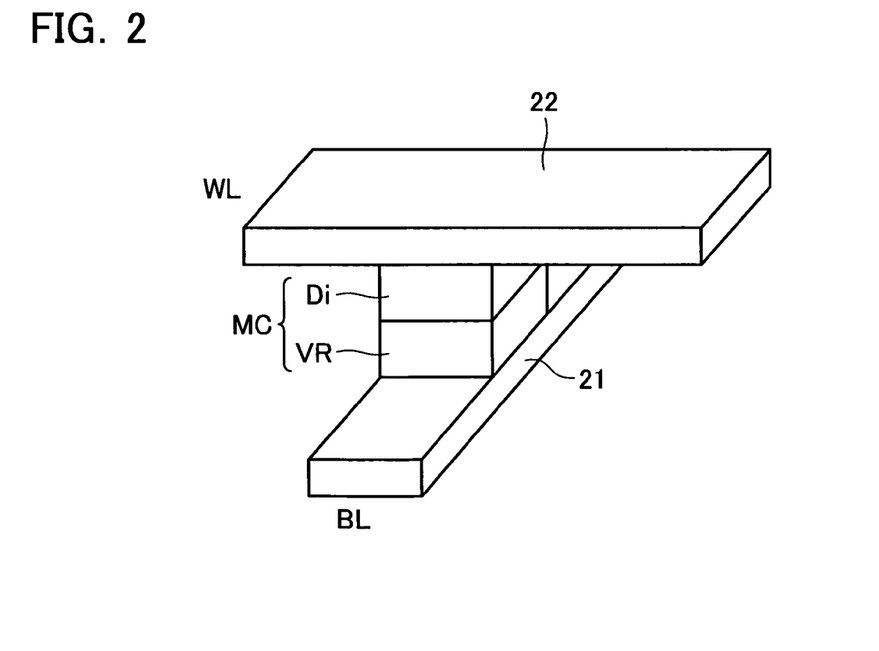
FIG. 2 shows a stacked structure of the memory cell.

The stacked structure of the memory cell MC is, for example, shown in FIG. 2. Variable resistance element VR and access element Di are stacked at the cross point of metal wirings 21 and 22, which serve as bit line BL and word line WL, respectively, and constitute a memory cell MC.

In this embodiment, memory cell MC stores multi-level data such as four-level data. To program such the multilevel data, a certain program pulse control is necessary in consideration of resistance change properties of the memory cell MC. Prior to the explanation of the program pulse control, the resistance change properties of the memory cell will be explained.

Figure 3:
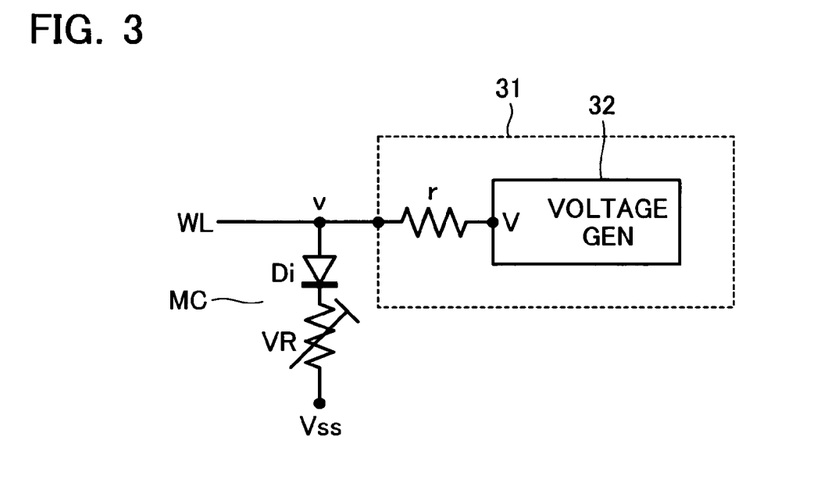
FIG. 3 shows a program condition change of the memory cell when it is applied with a constant voltage.
Figure 4:
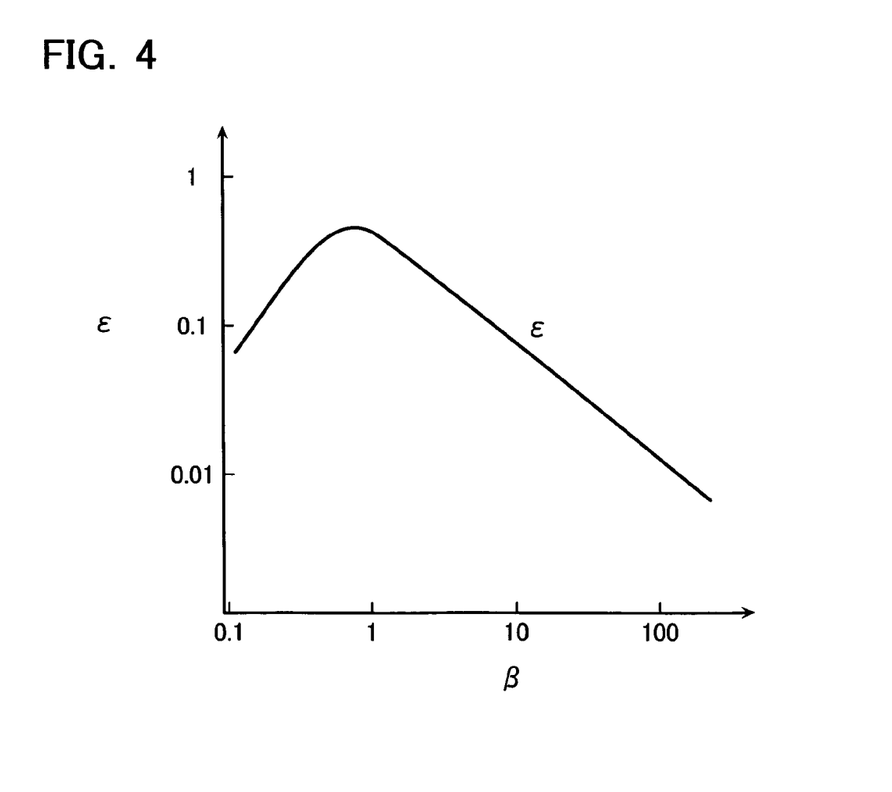
FIG. 4 is a diagram for explaining a relationship between the resistance value change and the power change of the memory cell.

With reference to FIGS. 3 and 4, it will be explained the outline of how power P generated in the memory cell changes in accordance with the resistance change of the recording layer. As shown in FIG. 3, program voltage generation circuit 31, which serves for applying program voltage to word line WL, is dealt with to have a constant voltage generation circuit 32 for outputting voltage "V" and resistance "r", which is inserted between the circuit 32 and the memory cell MC to contain word line resistance.

If strictly describing, memory cell's voltage and resistance value used here are those of variable resistance element VR and access element Di. However in the following explanation, memory cell's voltage and resistance value will be used on the condition that voltage and resistance value of access element Di is neglected. Assuming that memory cell's voltage and resistance value are expressed by "v" and "R", respectively, there are relationships shown in the following Expression (1) with a proportional parameter $\beta$.

$$R = \beta r$$

$$v = V\beta/(1+\beta) \quad \text{Expression (1)}$$

Power "P" generated in the memory cell will be expressed by the following Expression (2), in which $\epsilon$ is a function of $\beta$, i.e., $\epsilon = \beta/(1+\beta)^2$.

$$P = (V^2/r)\beta/(1+\beta)^2 \quad \text{Expression (2)}$$
$$= (V^2/r)\epsilon$$

As shown in FIG. 4, Power P is proportional to $\epsilon$, and $\epsilon$ is reversely proportional to $\beta$ in a rage where $\beta$ is larger than 1. FIG. 4 is a bi-logarithmic graph. Therefore, in a range of large $\beta$, when $\beta$ becomes ten times, $\epsilon$ becomes one tenth. Explaining in other words, when cell's resistance value becomes ten times, the generated power P becomes one tenth. This relationship will be declined in a range of small $\beta$ (i.e., cell's resistance value is small), and even if the resistance value becomes ten times, power P does not become one tenth, thereby resulting in that power P is not easily affected by the resistance change.

In a range of $\beta<1$, $\epsilon$ itself becomes small. However, comparing $\epsilon$ with voltage "v" in this case, as $\beta$ is decreased, power contributions become larger than the voltage contributions like that in the range of $\beta>1$ because there is a relationship of $v/P \propto 1+\beta$, i.e., $v/P$ is decreased with $\beta$ decreasing, in this range.

As described above, the heat generated in the memory cell (i.e., recording layer) becomes different in accordance with resistance value thereof, and the influence on the memory cell's resistance value based on the heat is changed in accordance with the resistance value itself. Therefore, to obtain a target resistance value, an appropriate voltage generation method is needed.

Figure 5:
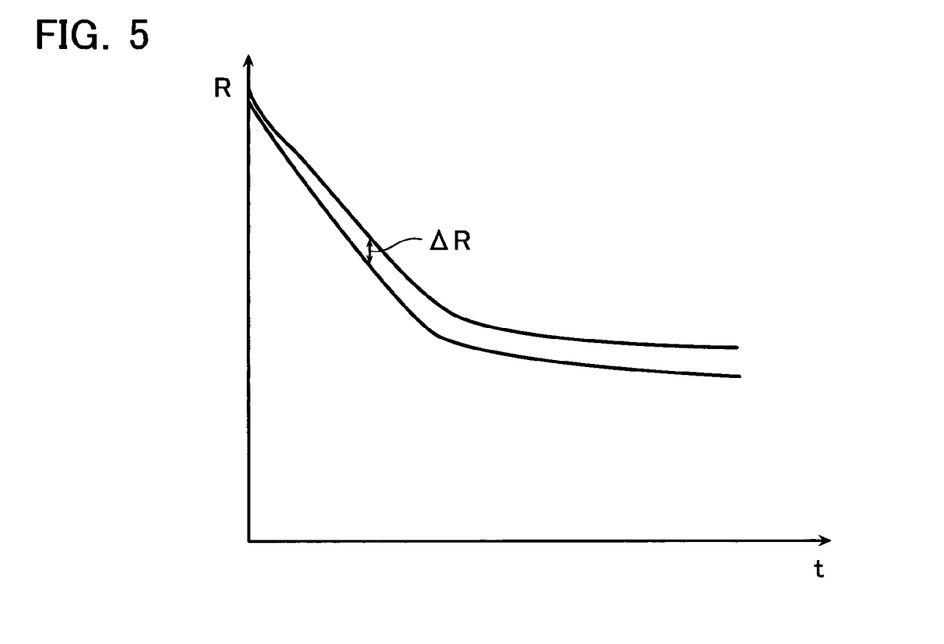
FIG. 5 shows a resistance change property when the memory cell's resistance value is decreased from a high resistance value.
Figure 6:
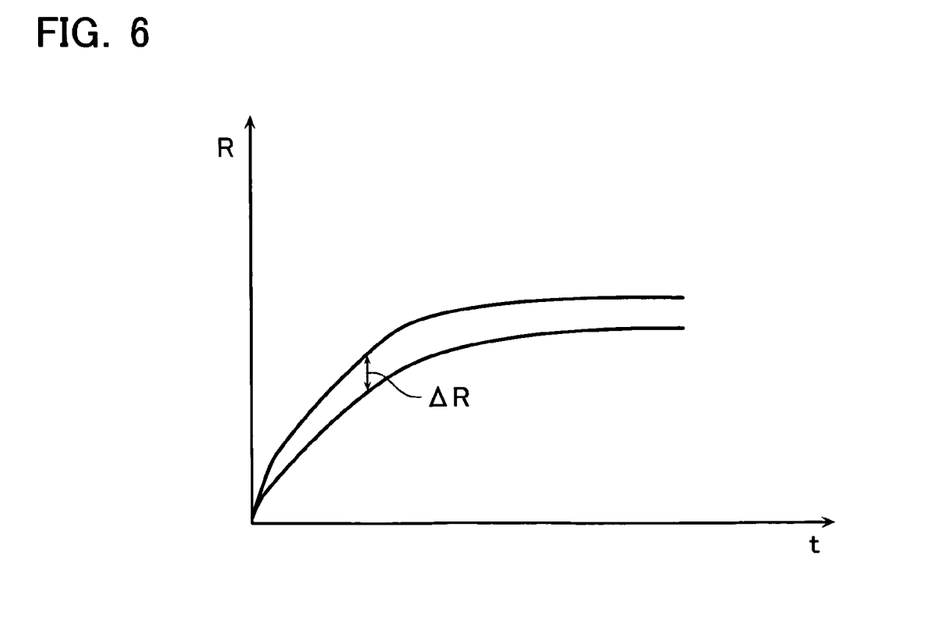
FIG. 6 shows a resistance change property when the memory cell's resistance value is increased from a low resistance value.

FIGS. 5 and 6 show resistance changes to be estimated for two cases where voltage is continuously applied to a memory cell during a certain time. Continuously applying voltage during a long time, Joule's heat is generated in the memory cell, and it is dispersed simultaneously to periphery. Therefore, the heat generation and its diffusion will reach an equalized state. When a resistance value transition based on the Joule's heat, which is generated as a result of that the state potential is over a certain potential barrier, is equalized to the reverse transition based on the cell's voltage, the resistance change will be decreased.

Explaining in detail, FIG. 5 shows such a resistance change that the cell's resistance value set in a high resistance state is decreased with voltage application while FIG. 6 shows another resistance change case where the cell's resistance state set in a low resistance state is increased with Joule's heat.

In the operation shown in FIG. 5, the voltage application is effective in an initial state where the memory cell has a high resistance value, and large resistance decreasing is generated in the initial state. When the resistance value is decreased to a certain level, the voltage applied to the cell is decreased while the Joule's heat is increased relatively. Therefore, as a result of that the resistance value increasing mode due to the Joule's heat is added, the resistance decreasing rate is lessened.

By contrast, in the operation shown in FIG. 6, the Joule's heat is effective in an initial state where the memory cell has a low resistance value, and large resistance increase is generated in the initial state. When the resistance value is increased to a certain level, the Joule's heat generated in the cell is decreased while the cell voltage is increased. Therefore, as a result of that the resistance value decreasing mode due to the voltage application is added, the resistance increasing rate is lessened.

Not only in case it starts from the high resistance value state but also in case it starts from the low resistance value state, the resistance value will be settled down to be substantially constant. The finally settled down resistance value or initial resistance value changing rate depends on the cell's environment, so that the resistance value will be variable with a certain indefinite component $\Delta R$. Therefore, it becomes difficult to program three or more target resistance values constituting multi-level data based on the relationship between the resistance value and voltage application time.

In consideration of the above-described program properties of the resistance change memory device, a program method in accordance with this embodiment is performed as follows: output voltage "V" of the program voltage generation circuit is set to be constant, and multiple voltage pulse applications are performed under the pulse width control, thereby setting a stable target voltage(s).

Figure 7:
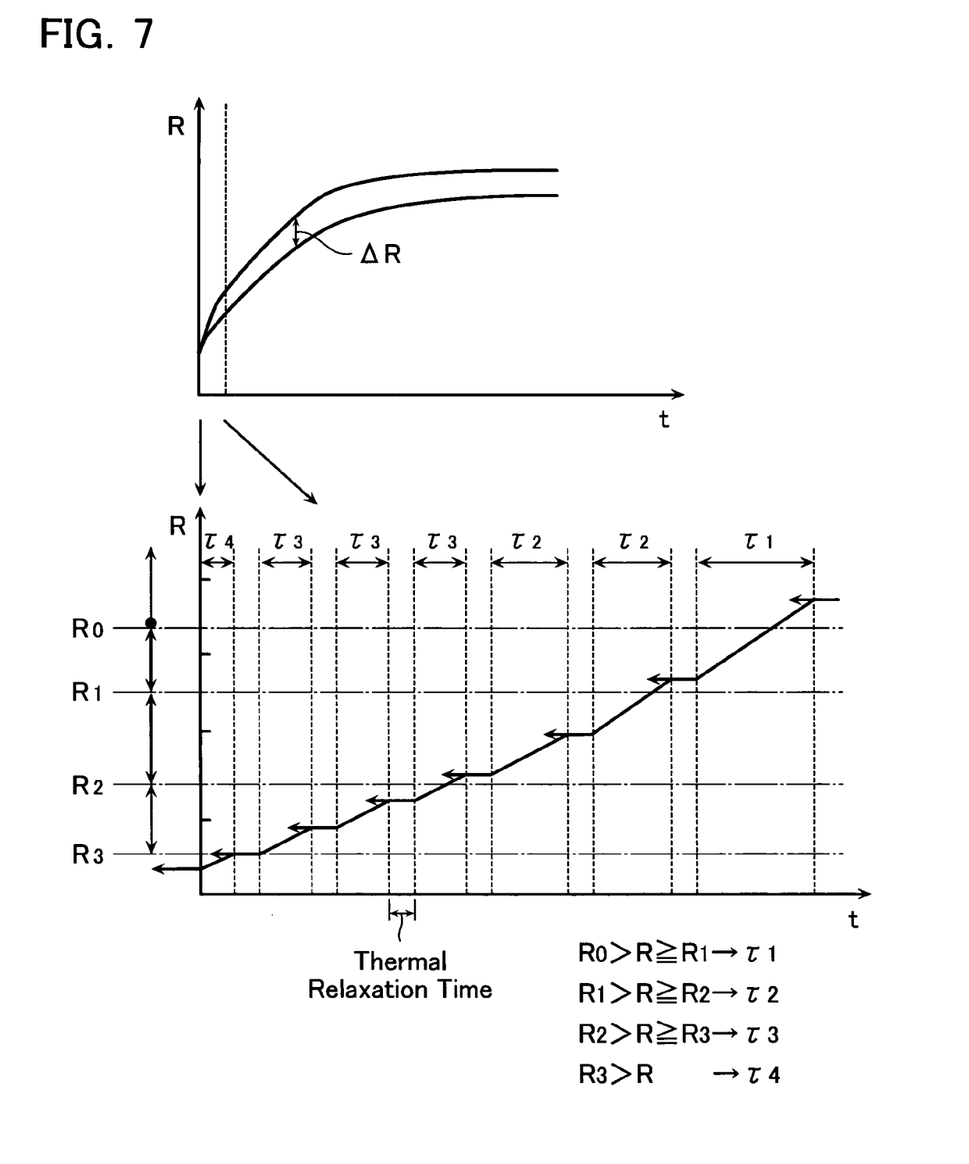
FIG. 7 shows a voltage pulse arrangement used in a data program mode in case of the property shown in FIG. 6.

FIG. 7 shows a program voltage pulse arrangement used in the case shown in FIG. 6, i.e., in the case where the cell's initial resistance value is low, and the resistance change (resistance increase) is due to the Joule's heat generated in the cell. There is kept a thermal relaxation time between each adjacent pulses. The thermal relaxation time is set to be equal to or longer than a thermal diffusion time constant of the Joule's heat generated in the cell, and serves for resetting the thermal environment of the cell after each pulse application.

Since the cell's resistance value increasing is a result of overcoming a potential barrier due to the Joule's heat, pulse width $\tau$ is determined to make the Joule's heat generated in each pulse width constant. As explained above, since $P=(V^2/r)\epsilon$, $\tau P$ is constant, and $\Sigma\epsilon$ is also constant, so that $\tau$ is substantially proportional to $\beta$ based on the above-described relationship between $\epsilon$ and $\beta$.

Therefore, if the resistance value becomes ten times, it becomes necessary to use ten times pulse width for generating a constant heat. In consideration of this point, it is practical to divide a resistance value range between the uppermost resistance value and the initial resistance value into multiple resistance value sections, and set the pulse widths for every section. For example, as shown in FIG. 7, the resistance value range is divided into five sections defined by boundary resistance values R0, R1, R2 and R3 (R0>R1>R2>R3). In accordance with which section the present resistance value after pulse application belongs to, the pulse width $\tau$ of the successive program voltage pulse is determined as expressed in the following Expression (3).

$$R0 > R \geq R1 \rightarrow \tau1$$

$$R1 > R \geq R2 \rightarrow \tau2$$

$$R2 > R \geq R3 \rightarrow \tau3$$

$$R3 > R \rightarrow \tau4 \qquad \text{Expression (3)}$$

The pulse width $\tau$ is set to make the Joule's heat at a typical resistance value in the corresponding section constant, i.e., to satisfy the relationship of $\tau4<\tau3<\tau2<\tau1$. Explaining in detail, in FIG. 7, at the beginning while resistance value R is lower than R3, and the Joule's heat is large, the program operation starts with the narrowest pulse width $\tau4$. When resistance value R becomes to satisfy R2>R$\geq$R3, the pulse width is changed to $\tau3$. Similarly, by use of such a method that the pulse width is increased when the resultant resistance value is over a corresponding boundary resistance, program may be performed under the condition that the Joule's heat generated every program voltage pulse application is substantially constant. In practice, it is not easy to control the generated Joule's heat to be constant. Therefore, it will be controlled to be in a certain range.

Figure 9:
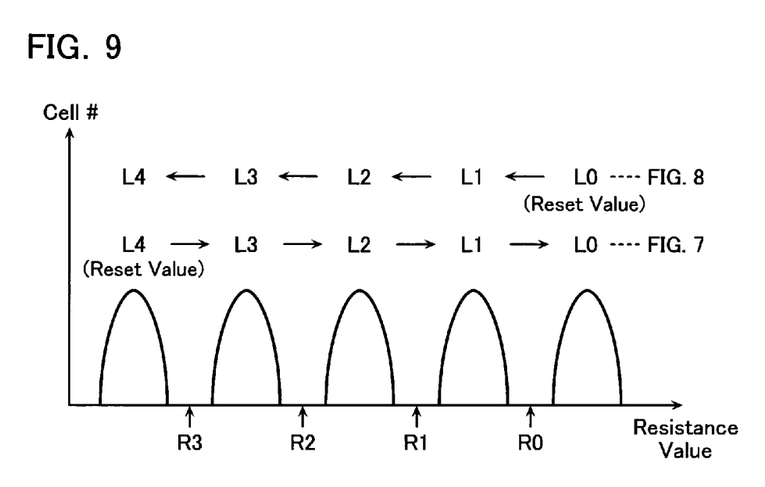
FIG. 9 shows multi-level data setting procedures by use of program voltage pulses shown in FIGS. 7 and 8.

Target resistance values used in multi-level data are selected from the resistance sections shown in FIG. 7. In this example, it is possible to set four data levels L0-L3 shown in FIG. 9, which are distinguishable by the boundary resistance values R0-R3. Level L4 lower than R3 will be used as serving as an initial value (i.e., reset value).

In case data levels L1 and L2, i.e., medium resistance values, are not stable, using only two data states, L3 (the lowest resistance value) and L0 (the highest resistance value), binary data storage will be performed with the same control as the embodiment of the multi-level storage scheme.

Figure 8:
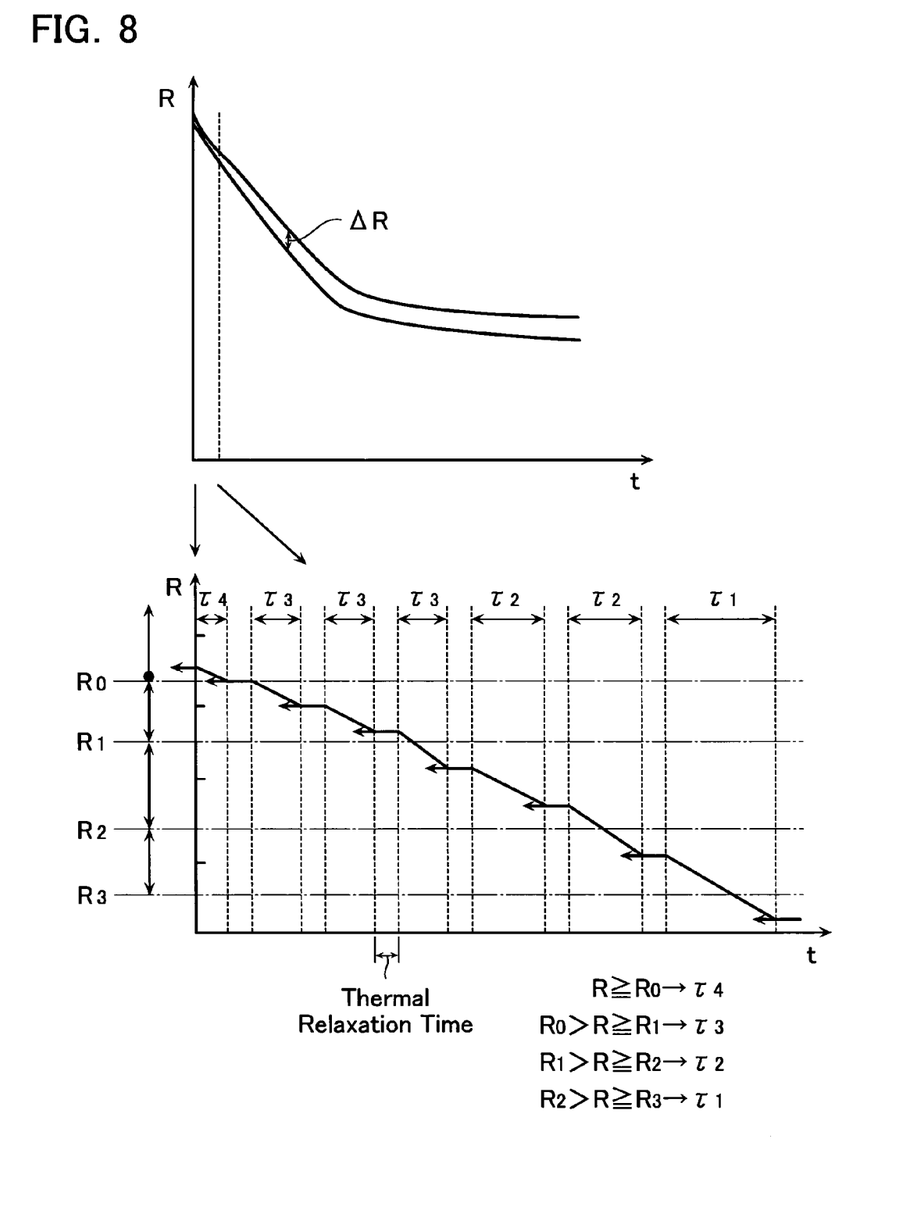
FIG. 8 shows a voltage pulse arrangement used in a data program mode in case of the property shown in FIG. 5.

FIG. 8 shows a program voltage pulse arrangement used in the case shown in FIG. 5, i.e., in the case where the cell's initial resistance value is high, and Joule's heat is small at the program beginning, the resistance change (resistance decrease) is due to the cell voltage.

In this case also, the constant voltage source "V" of the program voltage generation circuit is set at a high and constant value, and cell's resistance value is set with the voltage pulse width control and the number of pulses. Further, there is kept a thermal relaxation time between each adjacent pulses, which serves for resetting the thermal environment of the cell after each pulse application.

Since the cell's resistance value decreasing is a result of overcoming a potential barrier due to the cell's voltage, pulse width $\tau$ is determined to make the product of the cell's voltage "v" by the pulse width $\tau$ constant. As explained above, since $v=V\beta/(\beta+1)$, $\tau v$ is constant, then $\tau\beta$ becomes about $\beta+1$, so that $\tau$ is substantially constant without regard to the change of $\beta$ when $\beta \gg 1$.

In case the resistance value becomes extremely small, and then $\beta$ becomes extremely small, it is in need of setting $\tau$ to be large in the above-described condition. At this time, the influence of the Joule's heat becomes large. Therefore, it is desirable to set the lower limit of the resistance value and the upper limit of the voltage pulse width, whereby the low resistance value side is to be not used in a multi-level data programming mode with a high initial resistance value.

It is practical to divide a target voltage range into multiple sections, and set the pulse widths for every section. For example, as shown in FIG. 8, the resistance value range is divided into five resistance value sections defined by boundary resistance values R0, R1, R2 and R3 (R0>R1>R2>R3). If cell's resistance value becomes lower than R3, voltage pulses are not applied. In accordance with which section the resistance value after pulse application belongs to, the pulse width $\tau$ of the successive program voltage pulse is determined as expressed in the following Expression (4).

$$R \geq R0 \rightarrow \tau 4$$

$$R0 > R \geq R1 \rightarrow \tau 3$$

$$R1 > R \geq R2 \rightarrow \tau 2$$

$$R2 > R \geq R3 \rightarrow \tau 1 \qquad \text{Expression (4)}$$

Pulse width $\tau$ is set to satisfy $\tau v$=constant, so that the effect of voltage "v" applied to a typical memory cell in the corresponding resistance value section becomes constant. That is, it is set to satisfy the relationship of $\tau 4 < \tau 3 < \tau 2 < \tau 1$. Explaining in detail, in FIG. 8, at the beginning while resistance value R is higher than R0, and the cell's voltage is high, the program operation starts with the narrowest pulse width $\tau 4$. When resistance value R becomes to satisfy $R0 > R \geq R1$, the pulse width is changed to $\tau 3$. Similarly, by use of such a method that the pulse width is increased when the resultant resistance value is under a corresponding boundary resistance, program may be performed under the condition that $\tau v$ is substantially constant at every voltage pulse application. In practice, it is not easy to make $\tau v$ constant. Therefore, it will be controlled to be in a certain range.

Target resistance values used in multi-level data are selected from the resistance sections shown in FIG. 8. In this example, it is possible to set four data levels L1-L4 shown in FIG. 9, which are distinguishable by the boundary resistance values R0-R3. Level L0 set to be higher than R0 will be used as serving as an initial value (i.e., reset value).

In case multi-level data is set by use of resistance value increasing, the initial resistance value is set as low as possible, and the resistance value is decreased from it. In case multi-level data is set by use of resistance value decreasing, the initial resistance value is set as high as possible, and the resistance value is increased from it. That is, a cell's erase state is set as the lowest resistance value state in the resistance value increasing mode while it is set as the highest resistance value state in the resistance value decreasing mode.

Next, a program-verify (i.e., cell resistance verifying) operation will be explained. The cell resistance verify is for verifying whether the cell's resistance value is set in a certain resistance value section or not as a result of every program voltage application. There is prepared here a differential sense amplifier, which detects a cell current difference between a selected memory cell and a reference cell. The selected memory cell and the reference cell are coupled to a selected word line WL and a reference word line RWL, respectively, which are driven by read voltage Vread.

Figure 10:
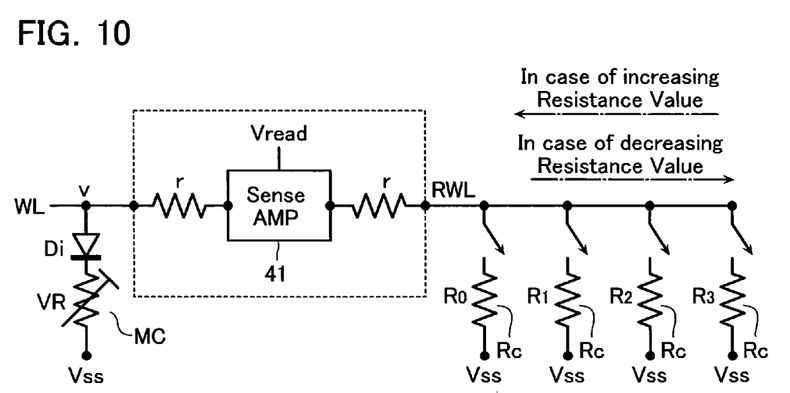
FIG. 10 shows a method of setting a reference resistance value at a verify time after programming.
Figure 11:
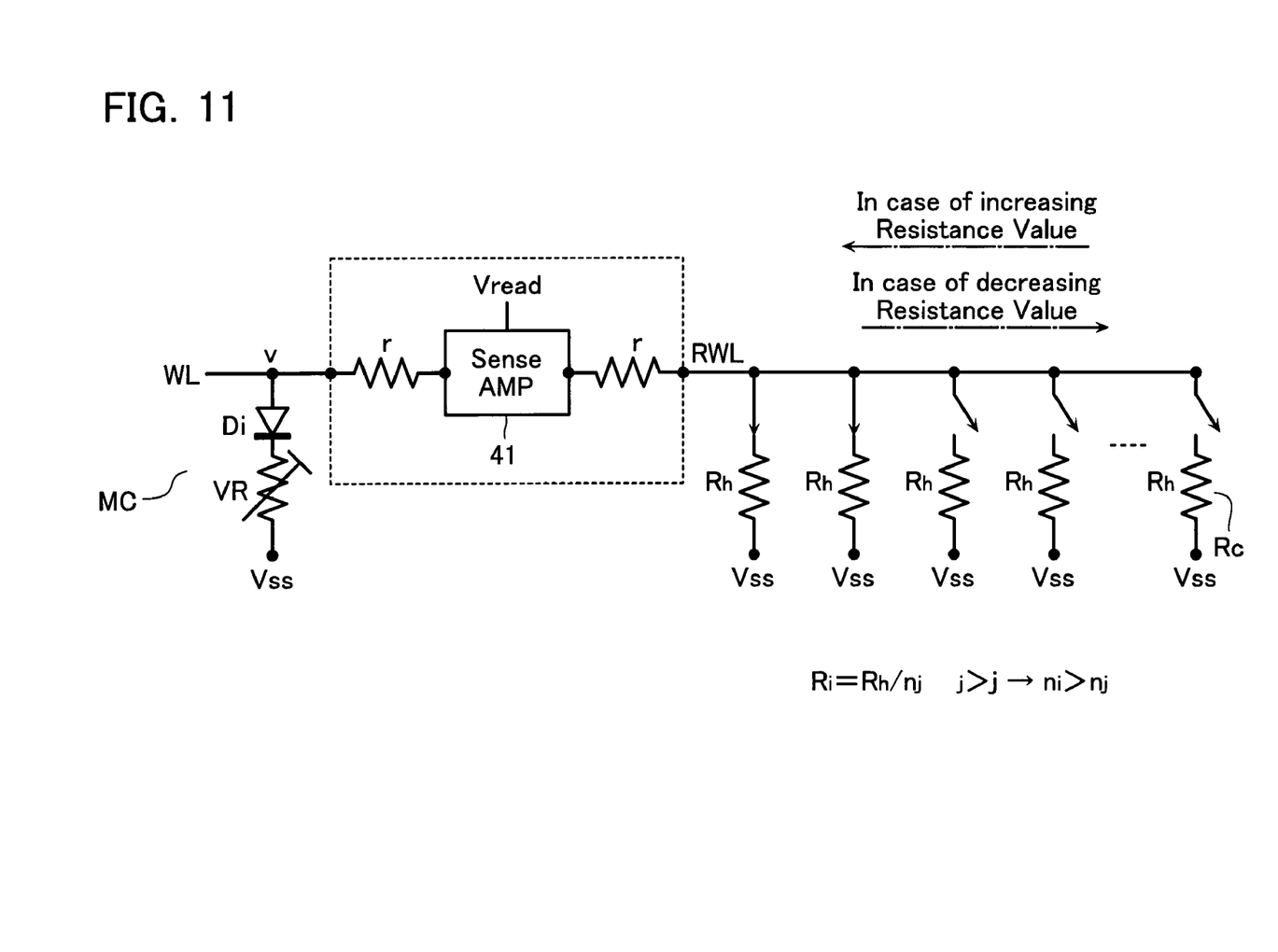
FIG. 11 shows another method of setting a reference resistance value at a verify time after programming.

FIGS. 10 and 11 show two kinds of verifying methods, the reference cell schemes of which are different from each other. At a verify-read time, voltage Vread is applied to word line WL and reference word line RWL via a sense amplifier 41 in place of the constant voltage "V" of the program voltage generation circuit. There is disposed the same resistance "r" between sense amplifier 41 and the memory cell MC as that disposed between the program voltage generation circuit and the memory cell.

In the scheme shown in FIG. 10, reference cells RC with the boundary resistance values R0-R3 are arranged along the reference word line. RWL to be selectively coupled to it. These reference cells RC are sequentially switched to serve for verify-reading. The reference cell's switching order used in the resistance value decreasing mode is reverse to that used in the resistance value increasing mode.

In the scheme shown in FIG. 11, reference cell RC is formed of multiple resistors with high resistance value Rh on the reference word line RWL, parallel-connection number "$n_i$" of which is selectable. Switching the number "$n_i$", reference resistance value $R_i = Rh/n_i$ will be obtained. The increasing/decreasing of the parallel-connection number used in the resistance value decreasing mode is reverse to that used in the resistance value increase mode.

Figure 12:
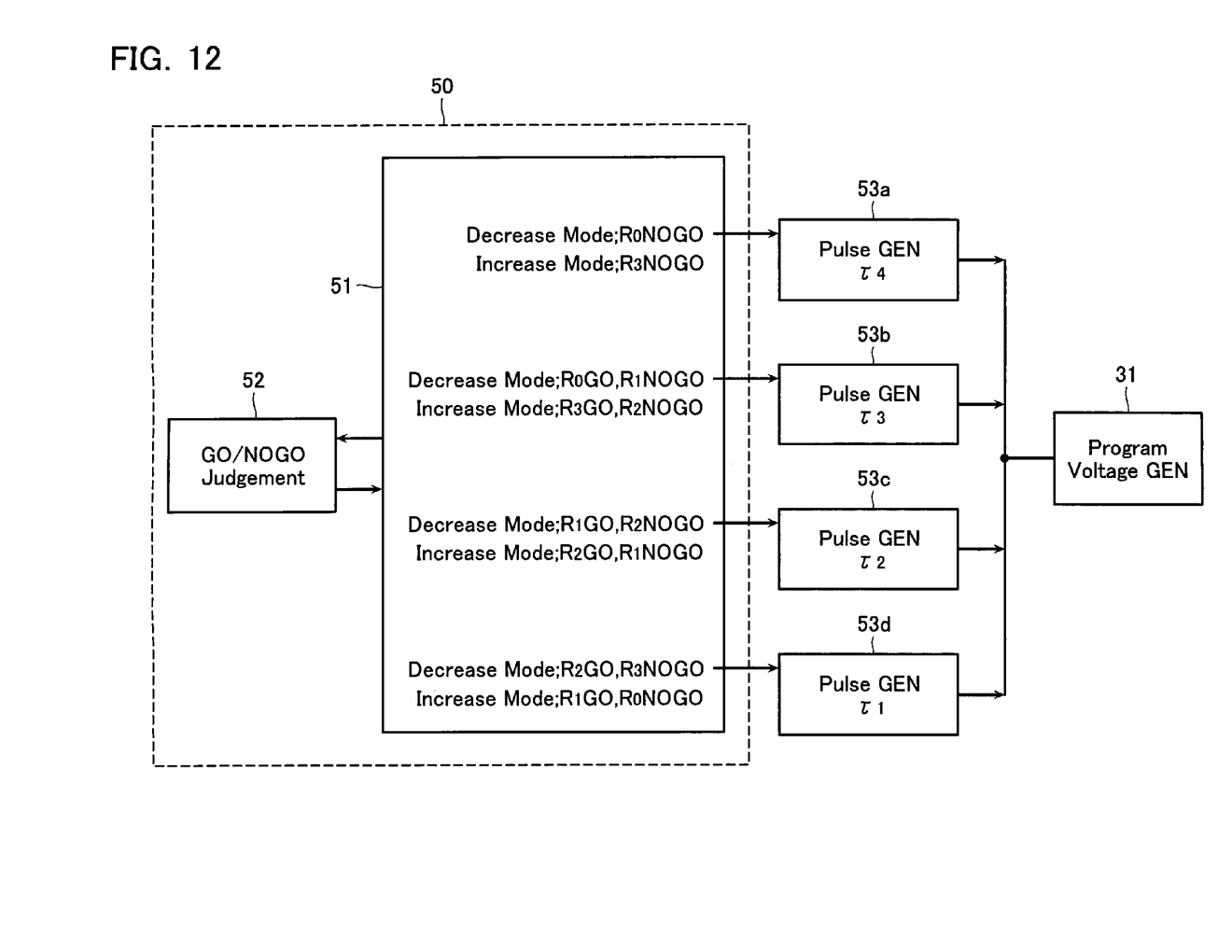
FIG. 12 shows a logic circuit for programming a resistance value, which selects pulse generation circuits in accordance with a verify-judged result.

FIG. 12 shows a pulse generation system, which selectively generates a program voltage pulse based on GO/NOGO judgment of the sense amplifier as a result of the verify-read. Reference resistance switching and pulse generation circuit selecting are linked and performed in reference resistance switching circuit 50. That is, the reference resistance switching is performed in response to the judgment result of GO/NOGO judgment circuit 52 based on the sense result, whereby one of the pulse generation circuits 53 (53a-53d) is selected. Pulse generation circuits 53 serve for controlling ON/OFF of cell voltage supplying with the program voltage generation circuit 31.

It should be noted here that when the cell resistance value is lower than the reference resistance value in the resistance value decrease mode, it is judged "GO" while when the cell resistance value is higher than the reference resistance value in the resistance value increase mode, it is judged "GO".

The reference resistance switching operation will be explained in detail below. As shown in FIG. 12, the above-described resistance value increase mode (FIG. 7) and resistance value decrease mode (FIG. 8) will be more simply referred to as "increase mode" and "decrease mode", respectively. $\tau 4$ pulse generation circuit 53a is selected in such a decrease mode that the resistance value has not yet been decreased to R0 (R0 NOGO) or in such an increase mode that the resistance value has not yet been increased to R3 (R3 NOGO). $\tau 3$ pulse generation circuit 53b is selected in such a decrease mode that the resistance value has been decreased to R0, but has not been decreased to R1 (R0 GO, R1 NOGO) or in such an increase mode that the resistance value has been increased to R3, but has not been increased to R2 (R3 GO, R2 NOGO).

Similarly, $\tau 2$ pulse generation circuit 53c is selected in response to R1 GO, R2 NOGO in the decrease mode or in response to R2 GO, R1 NOGO in the increase mode. $\tau 1$ pulse generation circuit 53d is selected in response to R2 GO, R3 NOGO in the decrease mode or in response to R1 GO, R0 NOGO in the increase mode.

The circuit blocks for judging the above-described GO and NOGO, i.e., GO/NOGO judging circuit 52 and reference resistance switching circuit 51, are arranged to constitute a resistance value program logic circuit 50.

Figure 13:
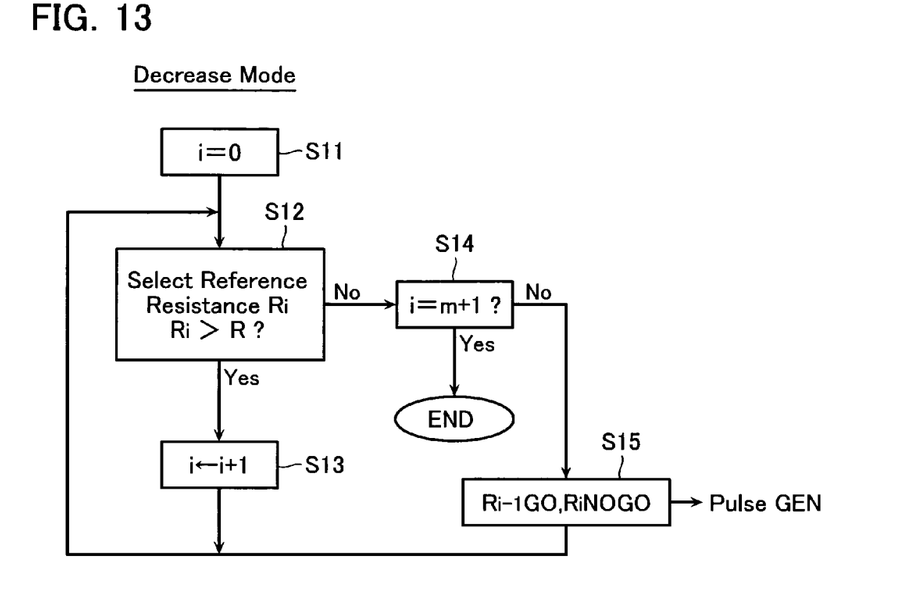
FIG. 13 shows a flow of the logic circuit in the resistance value decreasing mode.
Figure 14:
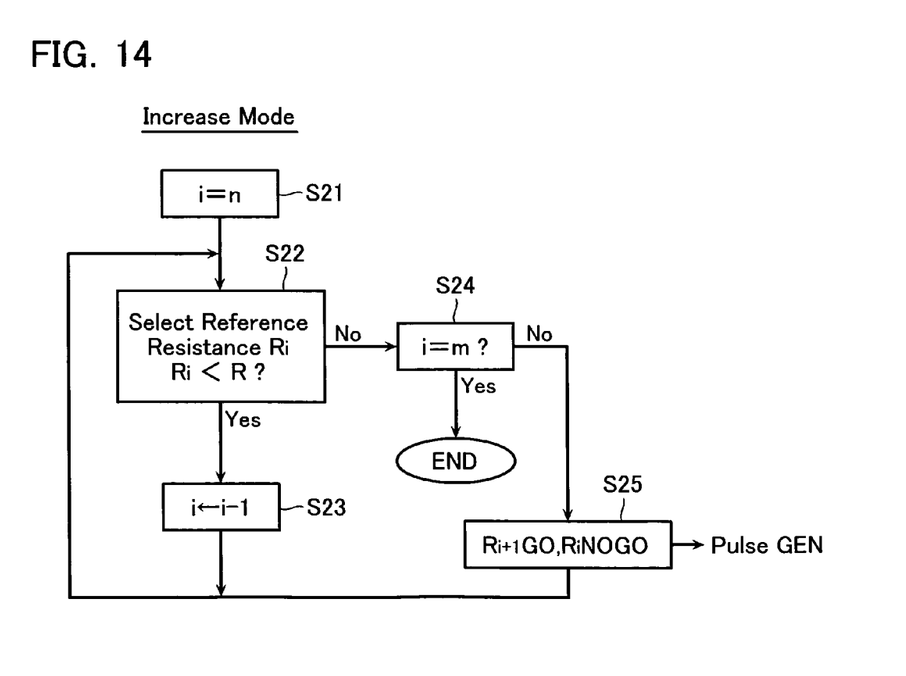
FIG. 14 shows a flow of the logic circuit in the resistance value increasing mode.

FIGS. 13 and 14 show operation flows of the resistance value program logic circuit 50 in the decrease mode and the increase mode, respectively. It is assumed here that target resistance value is Rd; and it is set between resistance value section "m" and "m+1", i.e., Rm>Rd>Rm+1.

As shown in FIG. 13, in the decrease mode, initial value i=0 is set (step S11), and then judge whether resistance R is lower than Ri or not (step S12). If Yes, "i" is stepped up (step S13), and the same judgment will be repeated (step S12).

If the judgment result is No, compare "i" with "m+1" (step S14). If Yes (i.e., matching is judged), this mode ends while if No (i.e., matching is not judged), a pulse generation circuit is selected in accordance with Ri−1 GO and Ri NOGO (step S15).

As shown in FIG. 14, in the increase mode, initial value i=n is set (step S21), and then judge whether resistance R is lower than Ri or not (step S22). If Yes, "i" is stepped down (step S23), and the same judgment will be repeated (step S22).

If the judgment result is No, compare "i" with "m" (step S24. If Yes (i.e., matching is judged), this mode ends while if No (i.e., matching is not judged), a pulse generation circuit is selected in accordance with Ri+1 GO and Ri NOGO (step S25). After the pulse generating, go to the judgment loop again.

In the above-described embodiment, a pulse width, i.e., a pulse-keeping time, is used as a pulse control factor. By contrast, it is effective to use a pulse height or a pulse shape, i.e., a composition of the pulse height and pulse width as the pulse control factor. This is easily possible by changing the pulse generation circuit and voltage source circuit. In this case, based on the resistance value as a result of the pulse application, the successive pulse state will be determined as similar to the above-described embodiment.

In this case, to make the Joule's heat generated in a cell constant, it is effective to apply such a pulse shape at each cycle as to make a time-integration value of cell's power constant, or make a time-integration value of cell's voltage constant.

This invention is not limited to the above-described embodiment. It will be understood by those skilled in the art that various changes in form and detail may be made without departing from the spirit, scope, and teaching of the invention.

INDUSTRIAL APPLICABILITY

There is provided a resistance change memory device, in which data is stably programmable.

The invention claimed is:

1. A method of programming a resistance change memory device, comprising:
    applying program voltage pulses to a memory cell for programming a target resistance value that is selected from multiple resistance values of the memory cell;
    setting thermal relaxation times between the respective program voltage pulses; and
    controlling each of the program voltage pulses, wherein
    multiple resistance value sections are defined by boundary resistance values set at respective boundaries in the multiple resistance values of the memory cell,
    a pulse width, a pulse height, or a pulse shape of the program voltage pulse is controlled with judging which resistance value section the cell's resistance value belongs to after applying every program voltage pulse,
    programming is performed as to bring the memory cell set at an initial value to have the target resistance value higher than the initial value in accordance with a Joule's heat generated in the memory cell by a preceding program voltage pulse application, and wherein
    the pulse width, the pulse height, or the pulse shape of each of the program voltage pulses is so controlled as to make the Joule's heat substantially constant.

2. A of programming a resistance change memory device comprising:
    applying program voltage pulses to a memory cell for programming a target resistance value that is selected from multiple resistance values of the memory cell;
    setting thermal relaxation times between the respective program voltage pulses; and
    controlling each of the program voltage pulses, wherein
    multiple resistance value sections are defined by boundary resistance values set at respective boundaries in the multiple resistance values of the memory cell,
    a pulse width, a pulse height, or a pulse shape of the program voltage pulse is controlled with judging which resistance value section the cell's resistance value belongs to after applying every program voltage pulse,
    programming is performed as to bring the memory cell set at an initial value to have the target resistance value lower than the initial value in accordance with a cell's voltage obtained by a preceding program voltage application, and wherein
    the pulse width, the pulse height, or the pulse shape of each of the program voltage pulses is so controlled as to make a the cell's voltage integration value substantially constant.

3. The method according to claim 1, wherein
    multiple resistors, which are set at the respective boundary resistance values, are disposed, one of the multiple resistors is selected as a reference resistance used at a program-verify time.

4. The method according to claim 1, wherein
    multiple resistors, each being set at a highest resistance value, are disposed to be parallel connectable, a parallel connection number of which is so selected as to constitute a reference resistance used at a program-verify time.

5. The method according to claim 1, further comprising:
    verifying whether a resistance value of the memory cell has reached the target resistance value or not after applying every program voltage pulse with a differential sense amplifier prepared for comparing current through the memory cell with current through a reference cell.

6. The method according to claim 1, wherein
    five resistance value sections are defined as the multiple resistance value sections by boundary resistance values R0, R1, R2, R3 and R4 (where R0>R1>R2>R3>R4), and pulse widths $\tau(\tau 4 < \tau 3 < \tau 2 < \tau 1)$ of the program voltage pulses are selected in accordance with which resistance value section in the five resistance value sections a memory cell's resistance value R belongs to, as follows: if R0>R≧R1 then the pulse width $\tau$ is $\tau 1$, if R1>R≧R2 then the pulse width $\tau$ is $\tau 2$, if R2>R≧R3 then the pulse width $\tau$ is $\tau 3$, and if R3>R then the pulse width $\tau$ is $\tau 4$, and wherein
    the memory cell is programmed from the initial value to the target resistance value under the condition that the Joule's heat generated in the memory cell is substantially constant.

7. The method according to claim 2, wherein
five resistance value sections are defined as the multiple resistance value sections by boundary resistance values R0, R1, R2, R3 and R4 (where R0>R1>R2>R3>R4), and pulse widths $\tau$ ($\tau 4 < \tau 3 < \tau 2 < \tau 1$) of the program voltage pulses are selected in accordance with which resistance value section in the five resistance value sections a memory cell's resistance value R belongs to, as follows: if R≧R0 then the pulse width $\tau$ is $\tau 4$, if R0>R≧R1 then the pulse width $\tau$ is $\tau 3$, if R1>R≧R2 then the pulse width $\tau$ is $\tau 2$, and if R2>R then the pulse width $\tau$ is $\tau 1$, and wherein the memory cell is programmed from the initial value to the target resistance value under the condition that the cell's voltage integration value is substantially constant.

* * * * *